(12) United States Patent
Tokuz et al.

(10) Patent No.: US 11,762,017 B2
(45) Date of Patent: *Sep. 19, 2023

(54) PERFORMING SCAN DATA TRANSFER INSIDE MULTI-DIE PACKAGE WITH SERDES FUNCTIONALITY

(71) Applicant: ADVANCED MICRO DEVICES, INC., Santa Clara, CA (US)

(72) Inventors: Ahmet Tokuz, Santa Clara, CA (US); Saurabh Upadhyay, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/532,469

(22) Filed: Nov. 22, 2021

(65) Prior Publication Data
US 2022/0082623 A1    Mar. 17, 2022

Related U.S. Application Data

(63) Continuation of application No. 16/658,514, filed on Oct. 21, 2019, now Pat. No. 11,181,579.

(51) Int. Cl.
*G01R 31/3185* (2006.01)
*G01R 31/3177* (2006.01)
*G06F 11/22* (2006.01)

(52) U.S. Cl.
CPC . *G01R 31/318583* (2013.01); *G01R 31/3177* (2013.01); *G01R 31/318572* (2013.01); *G06F 11/2236* (2013.01)

(58) Field of Classification Search
None
See application file for complete search history.

(56) References Cited

U.S. PATENT DOCUMENTS 8,650,524 B1 * 2/2014 Chakravadhanula ........................ G06F 30/327
716/136
9,285,421 B1 * 3/2016 Azi ................ G01R 31/31705
(Continued)

FOREIGN PATENT DOCUMENTS

WO    2011059439 A2    5/2011

OTHER PUBLICATIONS

E.-j. Kim, K.-J. Lee and S. Kim, "A high resolution Serializer and Deserializer architecture for mobile image sensor module," CCECE 2010, Calgary, AB, Canada, 2010, pp. 1-4, doi: 10.1109/CCECE.2010.5575153. (Year: 2010).*

(Continued)

*Primary Examiner* — Daniel F. McMahon

(57) ABSTRACT

A system for performing a scan test of a processor core includes a scan test module and a processor including a processor core and an input/output die, where the input/output die is coupled to the processor core. The scan test module transmits, in parallel to the input/output die, scan test input data. A serializer/deserializer module of the input/output die receives the input data, serializes the input data, and transmits the serialized input data to the processor core. A serializer/deserializer module of the processor core receives the serialized scan test input data, deserializes the input data, receives result data generated in dependence upon the input data, serializes the result data, and transmits the serialized result data to the input/output die. The input/output die serializer/deserializer module receives the result data, deserializes the result data, and provides the result data to the scan test module. Error detection can be carried out through redundancy.

20 Claims, 7 Drawing Sheets

(56) References Cited

U.S. PATENT DOCUMENTS

| | | |
|---|---|---|
| 2003/0149922 A1 | 8/2003 | Lai |
| 2009/0193303 A1 | 7/2009 | Giles et al. |
| 2010/0313089 A1 | 12/2010 | Rajski et al. |
| 2015/0036783 A1 | 2/2015 | Chen et al. |
| 2016/0349320 A1* | 12/2016 | Laisne ............. G01R 31/31724 |
| 2017/0115353 A1* | 4/2017 | Sonawane .......... G01R 31/2806 |
| 2017/0234925 A1* | 8/2017 | Kawoosa ......... G01R 31/31723 |
| | | 714/727 |
| 2020/0233031 A1* | 7/2020 | Abraham ......... G01R 31/31715 |

OTHER PUBLICATIONS

International Search Report & Written Opinion, PCT/US2020/055985, dated Feb. 8, 2021, 9 pages.

Sanghani et al., Design and Implementation of A Time-Division Multiplexing Scan Architecture Using Serializer and Deserializer in GPU Chips, 2011 9th IEEE VLSI Test Symposium, IEEE, DOI: 10.1109/VTS.2011.5783724, date added to IEEE Xplore: Jun. 2, 2011, 6 pages.

\* cited by examiner

PERFORMING SCAN DATA TRANSFER INSIDE MULTI-DIE PACKAGE WITH SERDES FUNCTIONALITY

CROSS-REFERENCE TO RELATED APPLICATIONS

This application is a continuation application of and claims priority from U.S. Pat. No. 11,181,579, issued Nov. 23, 2021.

BACKGROUND

After packaging a processor or a system on chip that includes a processor, testing is often performed to ensure that various components of the processor operate within defined parameters. Some components of the processor are inaccessible in normal operation by external equipment except through other components of the processor. Consider, for example, a core or core complex of a processor. A core may have no direct connection to external testing equipment except through various input/output interface components of the processor. To access such a core for testing, some processors are implemented with test-only components. Such test-only components, however, increase the cost of the processor while also reducing the utilizable die area for components of the processor used in typical operation. Further, the test data itself which is input into the processor for testing the core after packaging has continued to grow in size.

DETAILED DESCRIPTION

Figure 1:
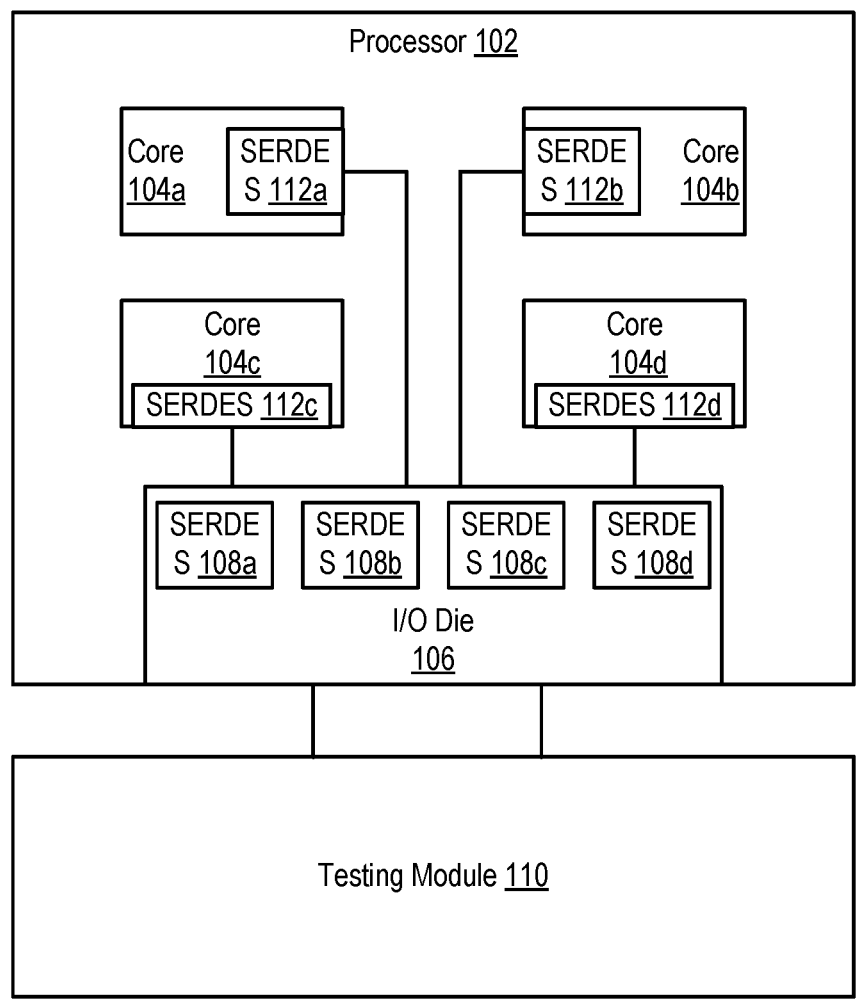
FIG. 1 sets forth a block diagram of an example processor in which a scan test of a processor core is carried out according to embodiments of the present disclosure.

Example methods, apparatus, and products for performing a scan test of a processor core are described in this specification. Various embodiments of performing a scan test of a processor core are described with regard to the figures below in greater detail. A processor core in the following examples includes one or more cores (or, synonymously, core complexes) that are normally inaccessible by testing apparatus external to the processor once packaged. The processor also includes an input/output (I/O) die. The I/O die is a monolithic data communications interface for the processor. That is, the I/O die operates as a communications interface between the processor and external components. The I/O die, during normal operation of the processor within a computer system, (such as a server) provides memory interfaces such as DDR (Double Data Rate) interfaces or bus interfaces such as PCI-type (Peripheral Component Interconnect) interfaces. The I/O die in such a processor is coupled on a point-to-point basis to each of the processor cores within the processor through one or more internal links. Some or all of the links coupling the I/O die to the processor cores are direct coupled (DC coupling).

In such a processor, performing a scan test of a processor core includes receiving, in parallel by a serializer/deserializer ('SERDES') module of an input/output die of a processor from a testing module, scan test input data. The SERDES module of the input/output ('I/O') die serializes the scan test input data. The SERDES module of the I/O die transmits, to a processor core of the processor, the serialized scan test input data. Such transmission is carried out over a subset of the above-mentioned DC coupled links after encoding the transmission with data strobe encoding.

A SERDES module of the processor core receives the serialized scan test input data, deserializes the serialized scan test input data, and provides the deserialized test input data to a device under test within the processor core. The device under test performs the test utilizing the input data and generates result data which is passed along to the SERDES module of the processor core. Responsive to receiving the result data, the SERDES module of the processor core serializes the result data and transmits the serialized result data to the I/O die. Such transmission is carried out over another subset of the above-mentioned DC coupled links after encoding the transmission with data strobe encoding.

The SERDES module of the I/O die receives the serialized result data, deserializes the serialized result data, and provides the deserialized result data to a testing module.

With multiple links, the SERDES modules of the I/O die and core enable large parallel packets of data to be transmitted over a finite and, in some cases, limited number of links. Further, such links are not 'test only' links but are utilized during normal operation of the processor outside of the testing phase. The data strobe encoding and decoding, along with the DC coupled nature of the links, eliminates the need for a phase lock loop to be implemented within the processor for clock recovery purposes during testing. Such phase lock loop circuitry is typically implemented with analog components within a processor that are higher cost, highly consuming of die area, and higher power consuming than digital equivalents.

For further explanation, FIG. 1 sets forth a block diagram of an example processor in which a scan test of a processor core is carried out according to embodiments of the present disclosure. The example of FIG. 1 includes a processor (102). The processor (102) includes a number of cores (104a, 104b, 104c, 104d). Each of the cores (104a, 104b, 104c, 104d) is coupled to an I/O die (106). The cores are coupled to the I/O dies through a number of DC coupled links. None of the cores can perform data communications with components external to the processor (102) except through the I/O die (106).

The I/O die (106) in the example processor (102) of FIG. 1 couples the cores (104), as well as other components not depicted here, to different types of components external to the processor for data communications. In some embodiments, the I/O die (106) provides PCIe, DDR bus, and other types of interfaces.

In the example of FIG. 1, the I/O die (106) includes a SERDES module (108a, 108b, 108c, 108d) for each core (104). As described below in greater detail, each SERDES module (108) of the I/O die (106) includes a transmitter component and a receive component. Each of the SERDES modules (108) of the I/O die (106) is coupled for communications through the links to a separate SERDES module (112a, 112b, 112c, 112d) included in each core.

The processor (102) in the example of FIG. 1 is coupled to a testing module (110) which provides scan test input data for the cores (104) to utilize in performing one or more various tests. Examples of such data include Automatic Test Pattern Generation ('ATPG') data.

In the example of FIG. 1, the testing module (110) provides to the I/O die (106) of the processor (102) scan test input data. The scan test input data is received, by any one or more of the SERDES modules (108) of the I/O die (106), in a parallel fashion.

The SERDES modules (108) that receive the scan test input data serialize the scan test input data and transmit the serialized test input data to the processor core (104) to which the SERDES module (108) is coupled. More specifically, the SERDES module (108) of the I/O die (106) provides the serialized scan test input data to the SERDES module (112) of the core (104).

The SERDES module (112) of the core (104) receives the serialized scan test input data, deserializes the serialized scan test input data, and the processor core (104) utilizes the scan test input data to generate result data. The SERDES module (112) of the core (104) serializes the generated result data and transmits the serialized result data to the coupled SERDES module (108) of the I/O die (106).

The SERDES module (108) of the I/O die (106) receives the serialized result data, deserializes the result data, and provides the deserialized result data to the testing module (110). Once the testing is complete, the SERDES modules of the core and I/O die are disabled. The processor then utilizes, for normal operation within a computing system, the same links coupling the I/O die to the cores that were utilized to carry test data. That is, the links utilized to perform the scan test are not 'test-only' links, but are instead utilized for primary operation of the processor.

Figure 2:
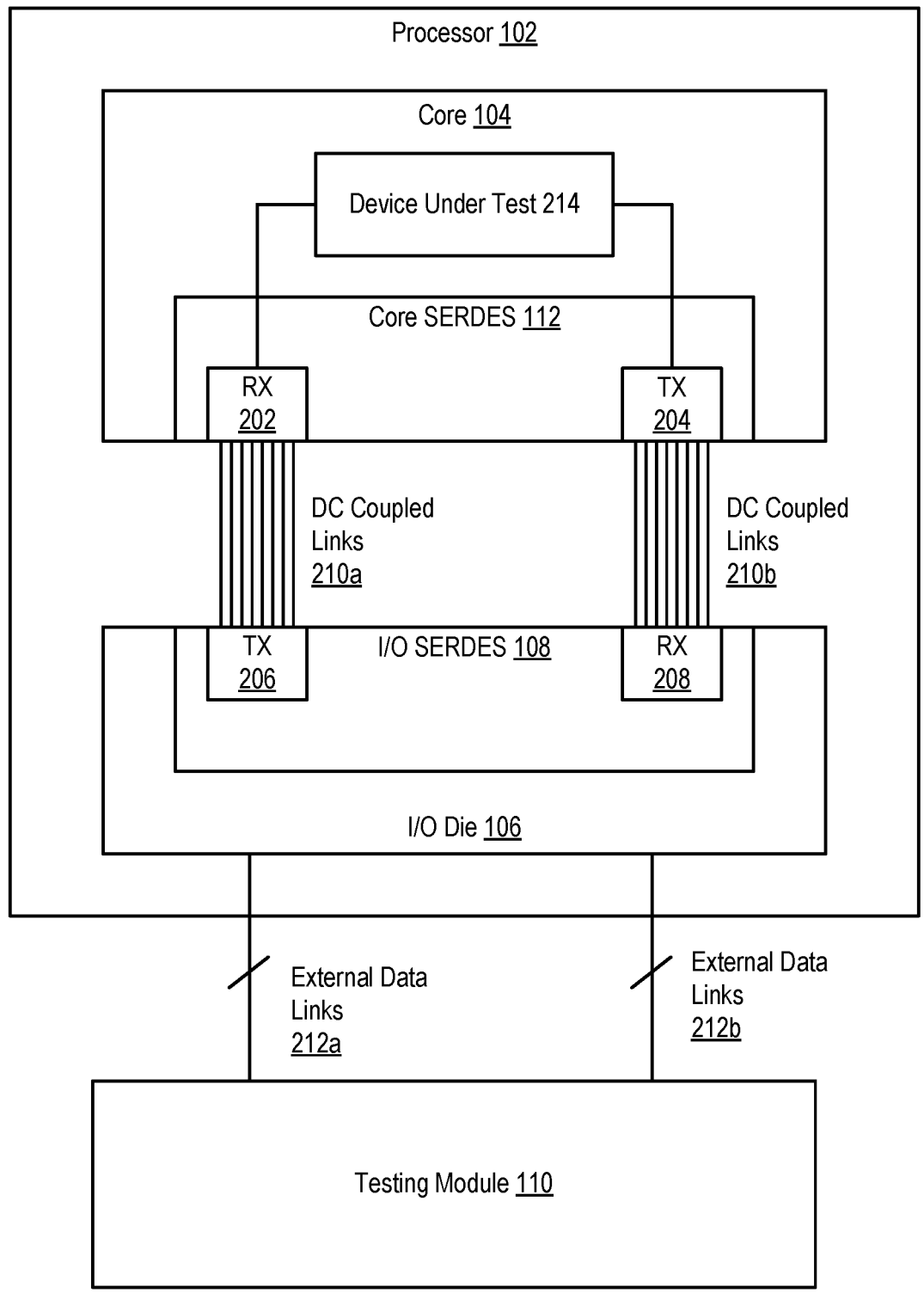
FIG. 2 sets for a functional block diagram of an example system for performing a scan test of a processor core in accordance with embodiments of the present disclosure.

For further explanation, FIG. 2 sets forth a functional block diagram of an example system for performing a scan test of a processor core in accordance with embodiments of the present disclosure. The system of FIG. 2 includes a processor (102) coupled through external links (212) to a testing module (110). The processor (102) includes a core (104) coupled to an I/O die (106) through a number of DC coupled links (210). The core (104) includes a SERDES module (112) that, in turn, includes a receive component (202) and a transmit component (204). The transmit component (204) of the core SERDES module (112) is coupled through one subset of the DC coupled links (210) to a receive component (208) of a SERDES module (108) of the I/O die (106). Likewise, the receive component (202) of the core SERDES module (112) is coupled through another subset of the DC coupled links (210) to a transmit component (206) of the I/O SERDES module (108).

In the example of FIG. 2, the core (104) is prohibited from being accessed by any external component (such as the testing module (110)) except through the I/O die (106). Rather than implement a test-only set of circuitry or logic, the processor (102) utilizes the existing DC coupled links and external links of the I/O die (106) to enable the testing module (110) to access the core (104) for testing.

In this example, the testing module (110) transmits to the I/O die (106), scan test input data in the form of an ATPG test bit pattern. The transmit component (206) of the I/O SERDES module (108) serializes the test bit pattern, encodes the test bit pattern with data strobe encoding, and transmits serialized portions of the test bit pattern over pairs of the DC coupled links (210a) to the receive component (202) of the core die SERDES module (112). Each pair of DC coupled links (210a) includes a link that carries the data portion of a serial transmission and a link that carries the strobe portion of the data transmission. In data strobe encoding, the clock is effectively encoded into the data and strobe signals. Further, because the links are DC coupled, a phase lock loop or other similar circuitry is not necessary for clock recovery at the receive components of the SERDES modules.

The receive component (202) of the core SERDES module (112) receives the serialized scan test input data, decodes the data and strobe transmission, deserializes the data and passes the deserialized data to a device under test (214) within the core (104). The device under test (214) utilizes the deserialized data to generate test results. The test results are then passed to the transmit component (204) of the core SERDES module (112). The transmit component (204) serializes the result data, encodes the result data with data strobe encoding, and transmits the data and strobe signals over pairs of DC coupled links (210b) to the receive component (208) of the I/O SERDES module (108). The receive component (208) decodes the received data and strobe signals, deserializes the result data, and passes the result data to the testing module (110).

Figure 3:
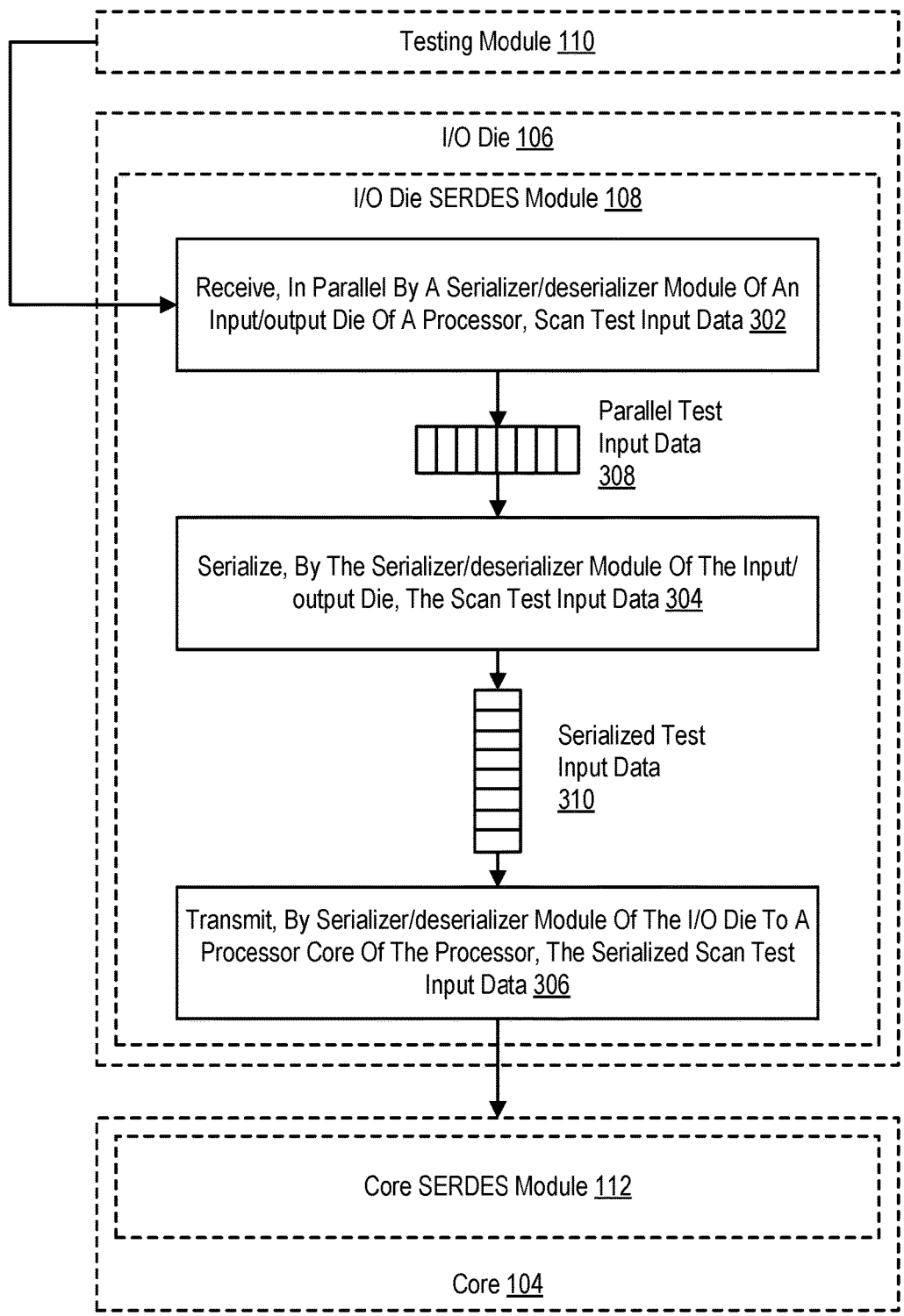
FIG. 3 sets forth a flow chart illustrating an example method of performing a scan test of a processor core in accordance with embodiments of the present disclosure.

For further explanation, FIG. 3 sets forth a flow chart illustrating an example method of performing a scan test of a processor core in accordance with embodiments of the present disclosure. The method of FIG. 3 includes receiving (302), in parallel by a serializer/deserializer module (108) of an input/output die (106) of a processor (102), scan test input data (308). Receiving such input data includes, in one example, storing the input data in one or more first-in-first-out ('FIFO') buffers.

The method of FIG. 3 also includes serializing (304), by the serializer/deserializer module (106b) of the input/output die (106), the scan test input data (310). Serializing (304) the scan test input data is carried out in some examples by clocking in each bit of the test data at a rate higher than the rate the parallel data is received.

The method of FIG. 3 also includes transmitting (306), by the serializer/deserializer module (108) of the input/output die (106) to a processor core (104) of the processor (102), the serialized scan test input data (310). In the example of FIG. 3, transmitting (306) the serialized scan test input data (310) also includes encoding the serialized scan test input data (310) with data strobe encoding. Data strobe encoding utilizes a pair of signal lines—one carries the 'Data' and one carries the 'Strobe.' During transmission either 'Data' or 'Strobe' changes logical value in one clock cycle, but both are prohibited from doing so during the same clock cycle. Generally, the 'Data' line transmits the data as-is while the 'Strobe' changes logical value state if and only if the data stays constant between two data bits.

Figure 4:
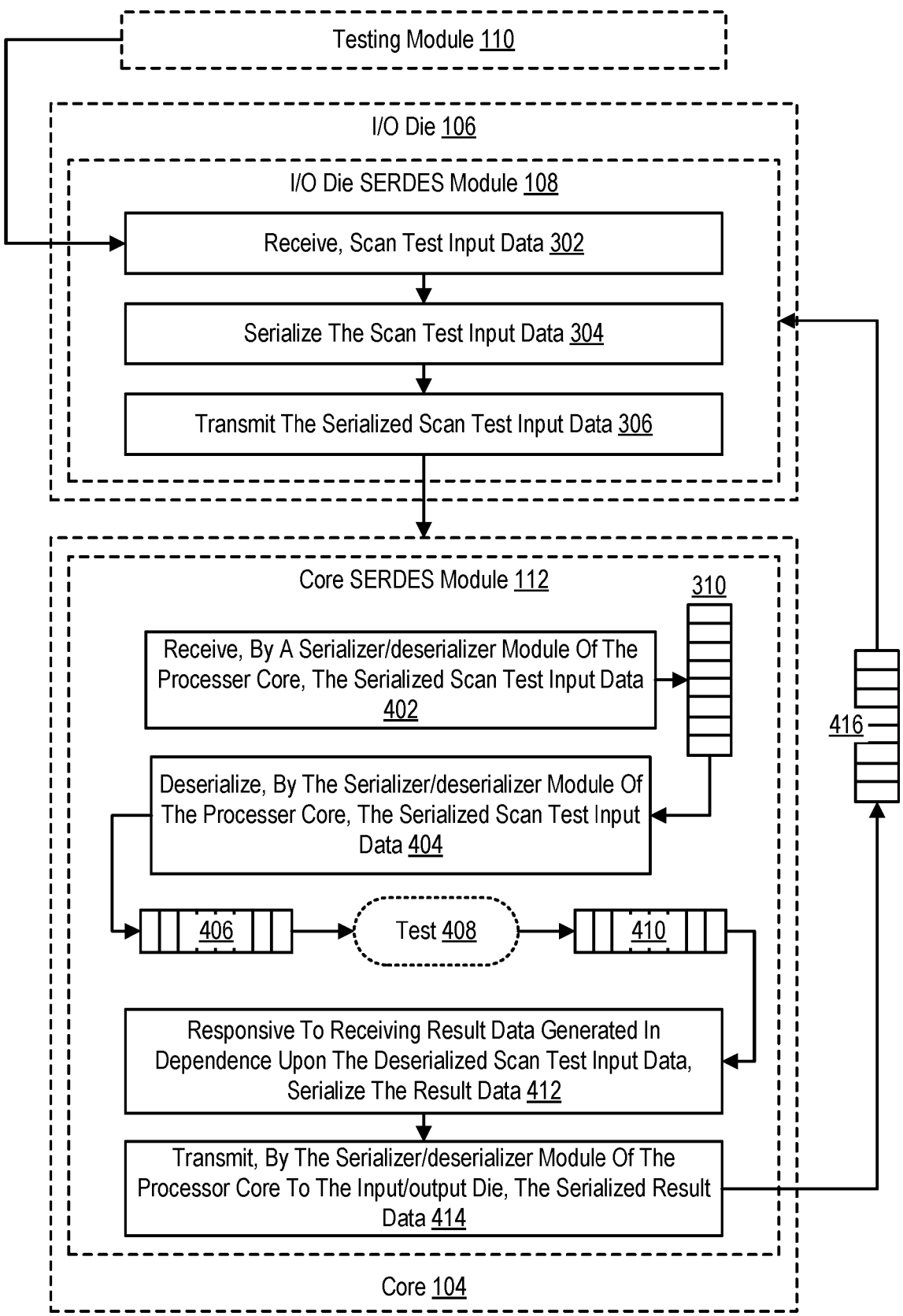
FIG. 4 sets forth a flow chart illustrating another example method of performing a scan test of a processor core in accordance with embodiments of the present disclosure.

For further explanation, FIG. 4 sets forth another example method of performing a scan test of a processor core in accordance with embodiments of the present disclosure. The method of FIG. 4 is similar to the method of FIG. 3 in that the method of FIG. 4 is carried out in a system that includes a processor core (104), an I/O die (106) and a testing module (110). The method of FIG. 4 is also similar to the method of FIG. 3 in that the method of FIG. 4 also includes: receiving (302), in parallel by a serializer/deserializer module (108) of an input/output die (106) of a processor, scan test input data; serializing (304), by the serializer/deserializer module (108) of the input/output die (106), the scan test input data; and transmitting (306), by serializer/deserializer module (108) of the input/output die (106) to a processor core (104) of the processor (102), the serialized scan test input data (310).

The method of FIG. 4 differs from the method of FIG. 3, however, in that the method of FIG. 4 includes receiving (402), by a serializer/deserializer module (112) of the processor core (104), the serialized scan test input data (310). The serializer/deserializer module (112) receives the serialized scan test input data (310) by buffering the received data in one or more FIFO buffers.

The method of FIG. 4 also includes deserializing (404), by the serializer/deserializer module (112) of the processor core (104), the serialized scan test input data (310). The core module (112) provides the deserialized scan test input data (406) to a device under test (408) which generates result data (410) based on the input data (406). Responsive to receiving the result data (410), the core SERDES module (112) serializes (412) the result data (410) and transmits the serialized result data (416) to the I/O die (106). In the method of FIG. 4, transmitting (414) the serialized result data (416) includes encoding the serialized scan test input data with data strobe encoding.

Figure 5:
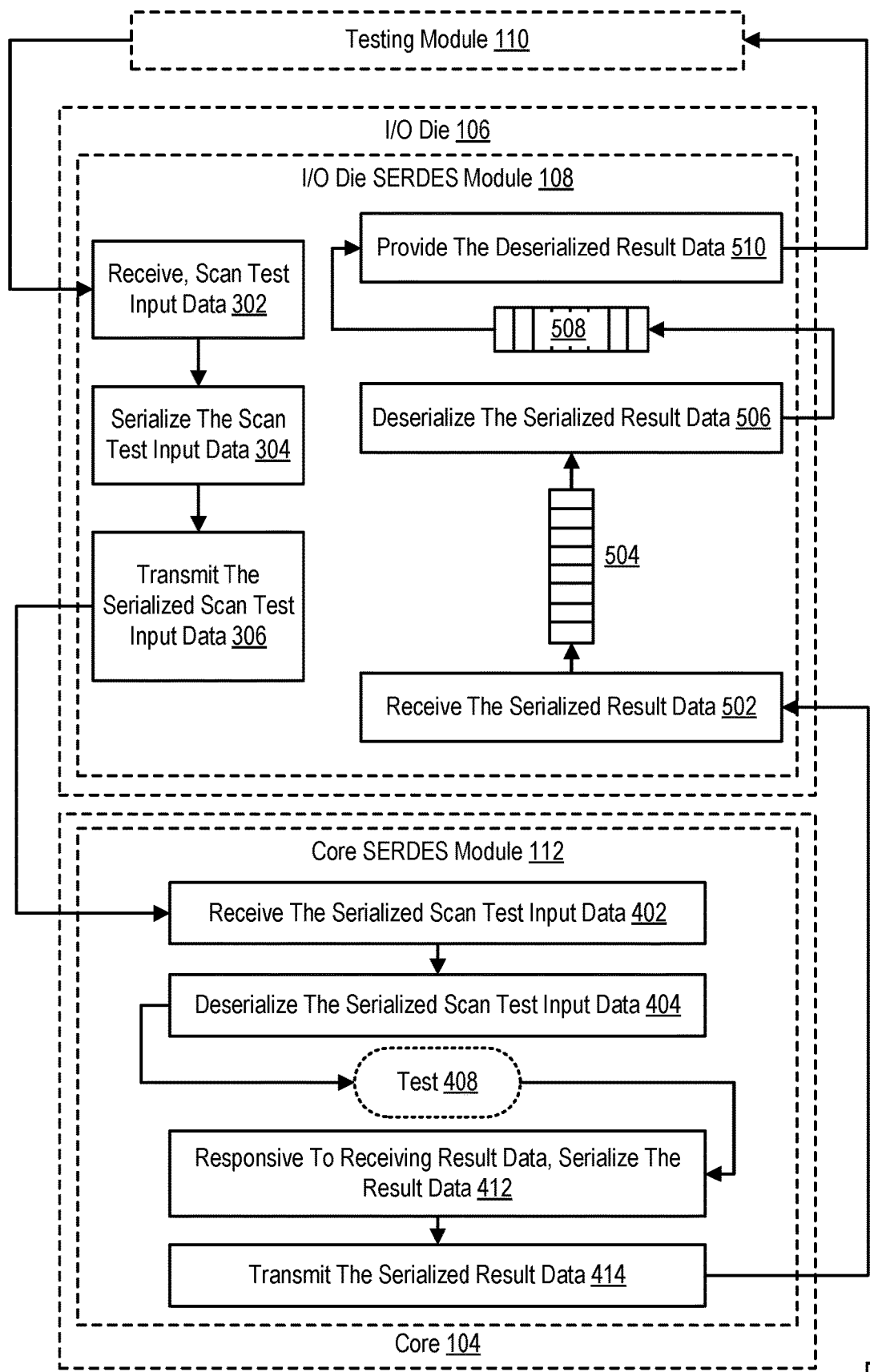
FIG. 5 sets forth a flow chart illustrating another example method of performing a scan test of a processor core in accordance with embodiments of the present disclosure.

For further explanation, FIG. 5 sets forth another example method of performing a scan test of a processor core in accordance with embodiments of the present disclosure. The method of FIG. 5 is similar to the method of FIG. 4 in that the method of FIG. 5 is carried out in a system that includes a processor core (104), an I/O die (106) and a testing module (110). The method of FIG. 5 is also similar to the method of FIG. 4 in that the method of FIG. 5 also includes: receiving (302) scan test input data; serializing (304) the scan test input data; and transmitting (306) the serialized scan test input data to the processor core (104). The method of FIG. 5 also includes receiving (402) the serialized scan test input data; deserializing (404) the serialized scan test input data; serializing (412) the result data; and transmitting (414) the serialized result data to the I/O die (106).

The method of FIG. 5 differs from the method of FIG. 4, however, in that the method of FIG. 5 includes receiving (502), by the serializer/deserializer module (108) of the input/output die (106), the serialized result data (504), deserializing (506), by the serializer/deserializer module (108) of the input/output die (106), the serialized result data; and providing (510), by the input/output die (106) to a testing module (110), the deserialized result data (508).

Figure 6:
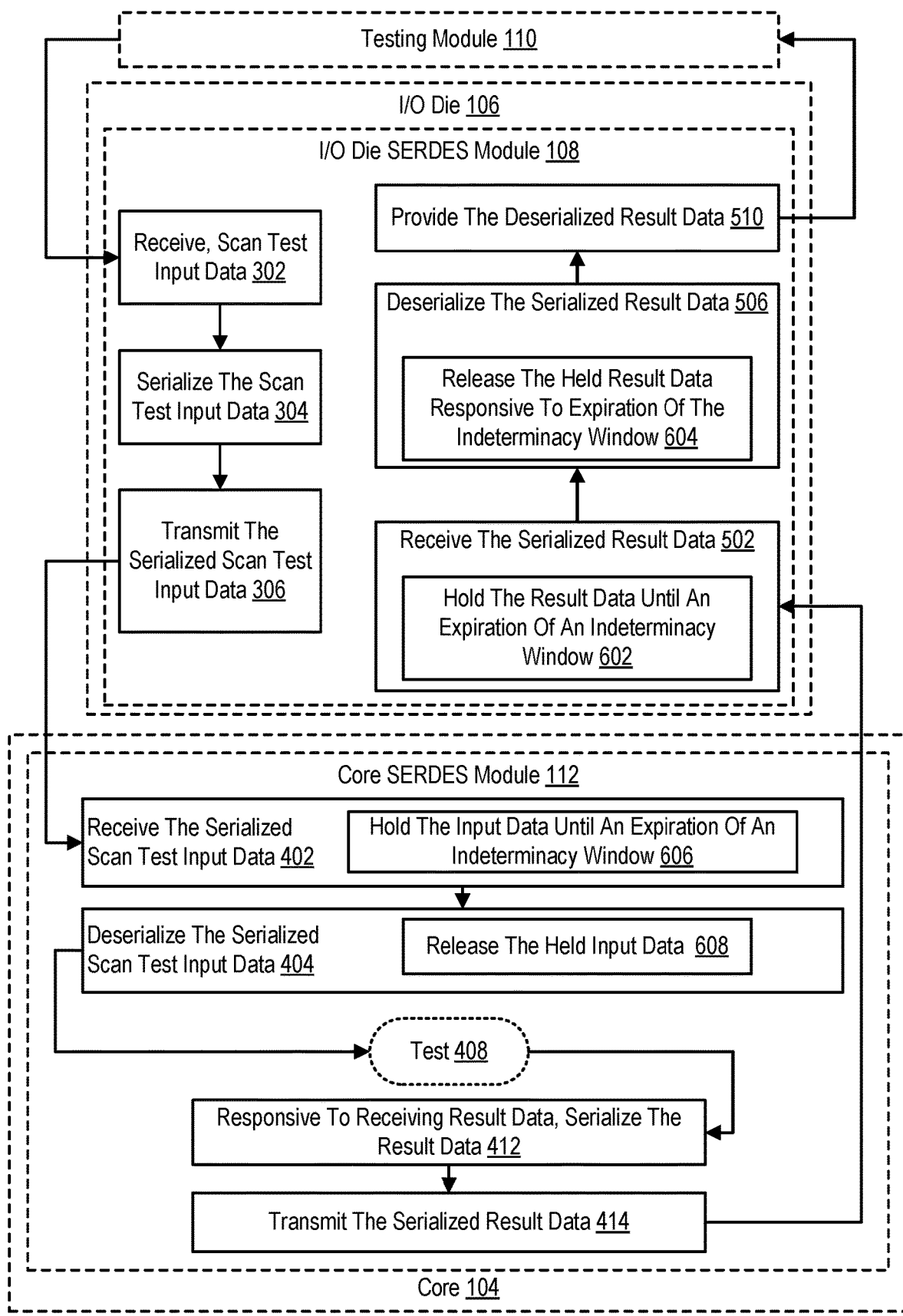
FIG. 6 sets forth a flow chart illustrating another example method of performing a scan test of a processor core in accordance with embodiments of the present disclosure.

For further explanation, FIG. 6 sets forth another example method of performing a scan test of a processor core in accordance with embodiments of the present disclosure. The method of FIG. 6 is similar to the method of FIG. 5 in that the method of FIG. 6 is carried out in a system that includes a processor core (104), an I/O die (106) and a testing module (110) and also includes:
 receiving (302) scan test input data;
 serializing (304) the scan test input data;
 transmitting (306) the serialized scan test input data to the processor core 104;
 receiving (402) the serialized scan test input data;
 deserializing (404) the serialized scan test input data;
 serializing (412) the result data;
 transmitting (414) the serialized result data to the I/O die 106;
 receiving (502) the serialized result data (504);
 deserializing (506) the serialized result data; and
 providing (510) the deserialized result data (508) to a testing module (110).

The method of FIG. 6 differs from the method of FIG. 5, however, in that in the method of FIG. 6, receiving (402), by a SERDES module (112) of the processor core (104), the serialized scan test input data includes holding (606) the scan test input data until an expiration of an indeterminacy window and deserializing (404), by the SERDES module (112) of the processor core (104), the serialized scan test input data includes releasing (608) the held scan test input data responsive to expiration of the indeterminacy window. The term 'indeterminacy window' as utilized here refers to a period of time (expressed in some instances in terms of clock cycles) during which the reception of the test data results is indeterminate. Test results are indeterminate for a variety of reasons. From die to die, even with the same architecture, there is clock crossing uncertainty, die-to-die data and strobe routing skew, and intra-die clock skew. Such variances introduce indeterminate transmission of signals into and out of the processor core. However, tolerances for these variances are often known and quantifiable. As such, the time that a symbol of a signal is indeterminate is both known and finite. This time is referred to here as an indeterminacy window. To that end, the data is held during a period in which the symbols are indeterminate and released after that period. Such holding and releasing is carried out in buffers through the use of roll-over counters that increment upon each clock cycle until the number of clock cycles making up an indeterminacy window is reached. Once the counter resets, the held data is released from the buffers.

Also in the method of FIG. 6, receiving (502), by the SERDES module (108) of the input/output die (106), the serialized result data includes holding (602) the result data until an expiration of an indeterminacy window. Deserializing (506), by the SERDES module (108) of the I/O die (106), the serialized result data in the method of FIG. 6 includes releasing (604) the held result data responsive to expiration of the indeterminacy window. Although shown in the example of FIG. 6 as being carried out in the serial domain—before deserialization—holding of the data until expiration of the indeterminacy window in some embodiments is carried out in the parallel domain post deserialization.

Figure 7:
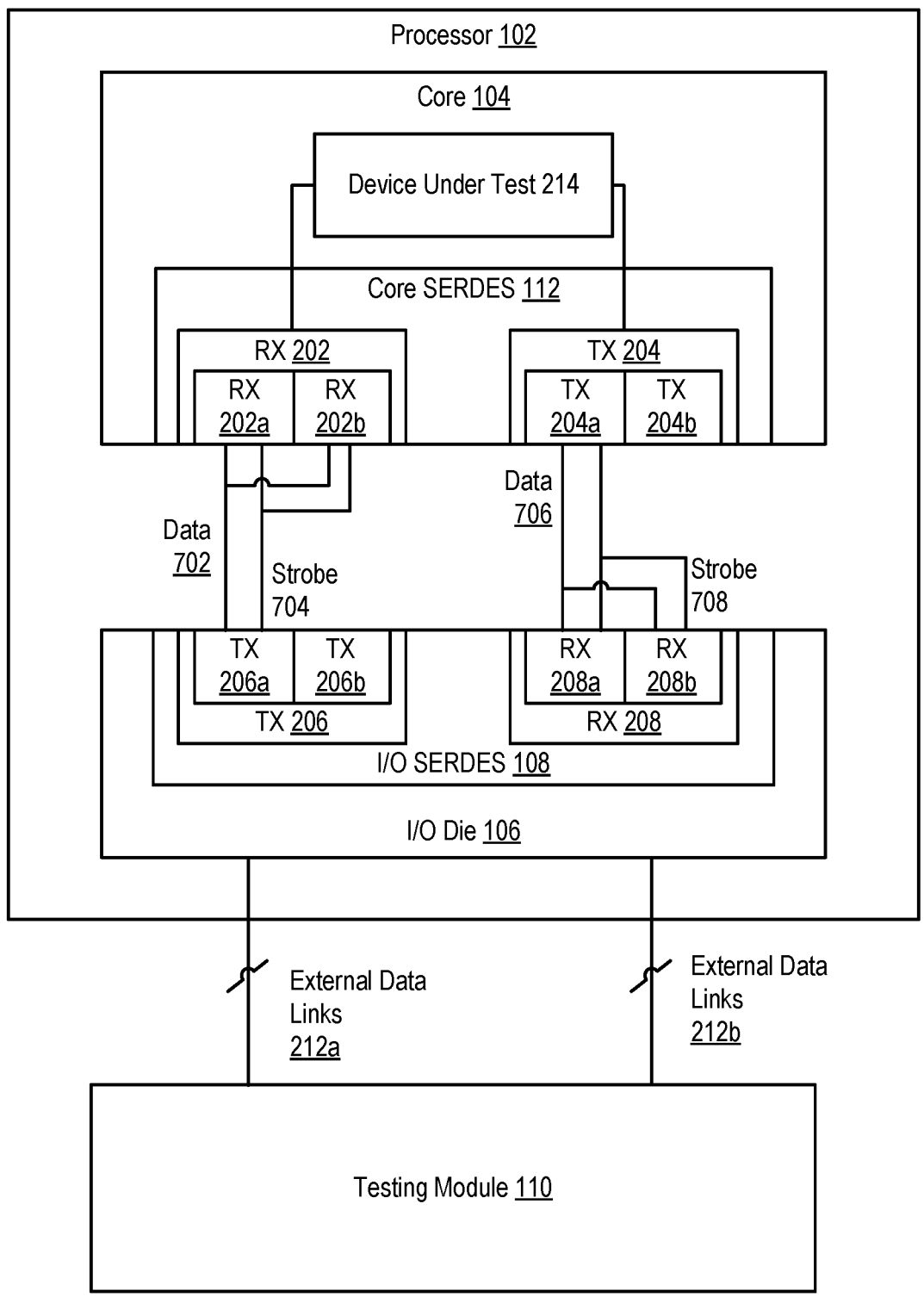
FIG. 7 sets forth a functional block diagram of an example system for performing a scan test of a processor core with error detection in accordance with embodiments of the present disclosure.

For further explanation, FIG. 7 sets forth a functional block diagram of an example system for performing a scan test of a processor core with error detection in accordance with embodiments of the present disclosure. The example system of FIG. 7 is similar to the example set forth in FIG. 2. The example system of FIG. 7 differs from that of FIG. 2 in that the system of FIG. 7 implements error detection. Such error detection is carried out through the use of an additional, unused lane of the SERDES connections between the I/O die (106) and the core (104). In FIG. 7, the core SERDES module (112) includes a two lane SERDES connection to the I/O SERDES module (108). The transmit logic (204) of the core SERDES module (112) includes two transmit blocks (204a, 204b) that each provide a lane for traffic between the core SERDES module (112) and I/O SERDES module (108). In FIG. 7, one transmit block (204a) provides data and strobe signals in the form of serialized output data to the receive logic (208) of the I/O SERDES module (108). Instead of providing the data (706) and strobe (708) signals to a single receive block, the transmit block (204*a*) of the first lane is coupled to the receive blocks (208*a*, 208*b*) of both lanes of the receive logic (208). The second lane receive block (208*b*) would otherwise be unused. Instead, the second lane receive block (208*b*) as well as the first lane receive block (208*a*) receives the data and strobe output signals. In this way, the data from both receive blocks (both lanes) that should otherwise match is compared and errors between the two can be detected.

In some embodiments, including the example of FIG. 7, the same concept of providing a copy of the data and strobe on a second, otherwise unused SERDES line to detect errors through comparison of the two copies is also implemented on the input data. In FIG. 7, for example, the transmit logic (206) of the I/O die (106) includes two different transmit blocks (one for each lane) (206*a*, 206*b*). The transmit block for a first lane (206*a*) may send a data (702) and strobe (704) signal for the input test data received from the testing module (110) to two different receive blocks (one for each SERDES lane) (202*a*, 202*b*) of the receive logic (202) of the core SERDES (112). The core SERDES (112) or other module may compare the two copies of the input data to determine whether any discrepancies and thus, data errors, are detected.

Readers of skill in the art will recognize that the links providing communication between the I/O die and the processor core (or core complex—which is also referred to here as a core) are repurposed during testing for testing purposes and then utilized in normal operation after testing is complete. Further, the SERDES modules provide a means by which a very large amount of parallel test data is input into a core that cannot otherwise access testing apparatus external to the processor when a finite number of links (less than those needed to carry the parallel data in its entirety) are available. The SERDES module is also comprised for synthesizable digital logic, which can be expressed in register-transfer level (RTL) design abstraction. Such RTL is implemented in a low cost manner, utilizing existing structures and components in the die design of a processor. Further, the area within which such digital logic is implemented is less than that of analog components that operates in a similar manner. Further, the synthesizable digital logic consumes less power than analog components. The RTL in some embodiments, is utilized in hardware description language to simulate the operation of processor during the scan testing.

No PLL is required due to the links between the I/O dies and the cores being DC coupled and the data strobe encoding described above. Removing the need for a PLL further reduces cost, power consumption, and modifications needed to an architecture of a processor. The test results are also deterministic due to the holding and releasing of results until the period during which the symbols are indeterministic passes.

Example embodiments are described largely in the context of a fully functional testing system. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Embodiments can be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to some embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

What is claimed is:

1. A method of performing a test of a processor core, the method comprising:
    serializing, by a serializer/deserializer module of an input/output interface of a processor, non-serialized test input data to produce serialized test input data; and
    transmitting, by the serializer/deserializer module of the input/output interface to a processor core of the processor, the serialized test input data.

2. The method of claim 1, wherein transmitting the serialized test input data to the processor core further comprises encoding the serialized test input data with data strobe encoding.

3. The method of claim 1, further comprising:
    receiving, by a serializer/deserializer module of the processor core, the serialized test input data;
    deserializing, by the serializer/deserializer module of the processor core, the serialized test input data to produce deserialized test input data;
    responsive to receiving result data generated in dependence upon the deserialized test input data, serializing the result data; and
    transmitting, by the serializer/deserializer module of the processor core to the input/output interface, the serialized result data.

4. The method of claim 3, further comprising:
    receiving, by the serializer/deserializer module of the input/output interface, the serialized result data;
    deserializing, by the serializer/deserializer module of the input/output interface, the serialized result data; and
    providing, by the input/output interface to a testing module, the deserialized result data.

5. The method of claim 3, wherein transmitting the serialized result data to the input/output interface further comprises encoding the serialized test input data with data strobe encoding.

6. The method of claim 4, wherein:
    receiving, by a serializer/deserializer module of the processor core, the serialized test input data further comprises holding the test input data until an expiration of an indeterminacy window, the indeterminacy window comprising a period of time during which a symbol transmitted between serializer/deserializer modules is indeterminate;
    deserializing, by the serializer/deserializer module of the processor core, the serialized test input data further comprises releasing the held test input data responsive to expiration of the indeterminacy window;
    receiving, by the serializer/deserializer module of the input/output interface, the serialized result data further comprises holding the result data until an expiration of the indeterminacy window; and
    deserializing, by the serializer/deserializer module of the input/output interface, the serialized result data further comprises releasing the held result data responsive to expiration of the indeterminacy window.

7. The method of claim 3, wherein the serializer/deserializer module of the input/output interface and the serializer/deserializer module of the processor core comprise at least two lanes, wherein each lane carries a redundant transmission and the method further comprises detecting an error in a transmission by comparing redundant transmission of the at least two lanes.

8. The method of claim 1, wherein links carrying transmissions between the input/output interface and the processor core are direct-coupled.

9. The method of claim 1, wherein the input/output interface comprises a monolithic data communications interface for the processor.

10. A processor for performing a test of a processor core, the processor comprising:
a processor core; and
an input/output interface, wherein the input/output interface is coupled to the processor core and the input/output interface includes a serializer/deserializer module configured to:
serialize non-serialized test input data to produce serialized test input data; and
transmit the serialized test input data to a processor core of the processor.

11. The processor of claim 10, wherein transmitting the serialized test input data to the processor core further comprises encoding the serialized test input data with data strobe encoding.

12. The processor of claim 10, wherein the processor core further comprises a core serializer/deserializer module configured to:
receive the serialized test input data;
deserialize the serialized test input data to produce deserialized test input data;
serialize result data generated in dependence upon the deserialized test input data; and
transmit the serialized result data to the input/output interface.

13. The processor of claim 12, wherein the serializer/deserializer module of the input/output interface is further configured to:
receive the serialized result data;
deserialize the serialized result data; and
provide the deserialized result data to a testing module.

14. The processor of claim 10, wherein links carrying transmissions between the input/output interface and the processor core are direct-coupled.

15. The processor of claim 10, wherein the input/output interface comprises a monolithic data communications interface for the processor.

16. The processor of claim 10, wherein the serializer/deserializer module operates only for testing.

17. The processor of claim 12, wherein the serializer/deserializer modules comprise synthesizable digital logic.

18. The processor of claim 10, wherein the test is performed at a time after packaging of the processor, prior to installation of the processor in a computer system.

19. The processor of claim 10, wherein the processor further comprises a plurality of processor cores, wherein each processor core is coupled independently to the input/output interface and each processor core is prohibited from data communications external to the processor except through the input/output interface.

20. A system for performing a test of a processor core, the system comprising:
a test module; and
a processor comprising a processor core and an input/output interface, the input/output interface coupled to the processor core, wherein:
the test module transmits, in parallel to the processor via the input/output interface, test input data;
a serializer/deserializer module of the input/output interface:
receives the test input data;
serializes the test input data to produce serialized test input data; and
transmits, the serialized test input data to the processor core of the processor;
a serializer/deserializer module of the processor core:
receives the serialized test input data;
deserializes the serialized test input data to produce deserialized test input data;
receives result data generated in dependence upon the deserialized test input data;
serializes the result data to produce serialized result data; and
transmits the serialized result data to the input/output interface; and
the serializer/deserializer module of the input/output interface:
receives the serialized result data;
deserializes the serialized result data to produce deserialized result data; and
provides the deserialized result data to the test module.

* * * * *